United States Patent
Franz et al.

(10) Patent No.: US 11,729,934 B2
(45) Date of Patent: Aug. 15, 2023

(54) SYSTEM FOR SECURING A COMPUTING SYSTEM IN A HOST INFRASTRUCTURE

(71) Applicant: Hewlett Packard Enterprise Development LP, Houston, TX (US)

(72) Inventors: John Franz, Houston, TX (US); Michael Hanson, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 87 days.

(21) Appl. No.: 17/249,449

(22) Filed: Mar. 2, 2021

(65) Prior Publication Data
US 2022/0287196 A1    Sep. 8, 2022

(51) Int. Cl.
*H05K 7/14*      (2006.01)
(52) U.S. Cl.
CPC ......... *H05K 7/1401* (2013.01); *H05K 7/1488* (2013.01)
(58) Field of Classification Search
CPC .................................................... H05K 7/1409
See application file for complete search history.

(56) References Cited

U.S. PATENT DOCUMENTS

| | | | |
|---|---|---|---|
| 4,083,616 A | 4/1978 | Mcniece et al. | |
| 4,313,150 A | 1/1982 | Chu | |
| 4,521,063 A | 6/1985 | Mile | |
| 5,140,501 A | 8/1992 | Takahashi et al. | |
| 5,414,594 A * | 5/1995 | Hristake | H05K 7/1409 439/153 |
| 7,297,008 B2 * | 11/2007 | Griffin | H05K 7/1409 439/157 |
| 9,253,914 B2 | 2/2016 | Demange | |

* cited by examiner

*Primary Examiner* — Jerry Wu
(74) *Attorney, Agent, or Firm* — Hewlett Packard Enterprise Patent Department (57) ABSTRACT

Examples described herein relate to a securing sub-system. The securing sub-system includes a lever and a cam assembly engaged with the lever. The cam assembly is movable due to a pivotal movement of the lever and includes a cam body, a cantilevered arm, and a load support member. The cantilevered arm extends from the cam body and is deformable when the cantilevered arm contacts a restrictive structure. The load support member disposed on the insertion cam. A portion of the load support member is offset from an open end of the cantilevered arm to limit deformation of the cantilevered arm. Further, some examples described herein relate to a securing system including a plurality of securing sub-systems coupled via a synchronous movement link is also presented. Moreover, certain examples described herein relate to a computing system including at least one such securing sub-system.

20 Claims, 7 Drawing Sheets

SYSTEM FOR SECURING A COMPUTING SYSTEM IN A HOST INFRASTRUCTURE

BACKGROUND

IT infrastructures such as data centers host multitude of computing systems in a common facility. The computing systems hosted in the IT infrastructures may include, but are not limited to, servers, storage devices, network switches, routers, WLAN access points, and the like. The servers may be blade servers, for example. The storage devices may be storage blades or storage arrays, for example. In some data centers, the computing systems may be hosted in one or more racks or system enclosures, such as, blade enclosures housing one or more blades (e.g., blade servers, storage blades, etc.).

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements may be coupled mechanically, electrically, or communicatively linked through a communication channel, pathway, network, or system. Further, the term "and/or" as used herein refers to and encompasses any and all possible combinations of the associated listed items. It will also be understood that, although the terms first, second, third, fourth, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Typically, the host infrastructure (i.e. racks and/or enclosures that are used to host computing systems in data centers) may include mechanical structures (e.g., rails/tracks) for installing the computing systems therein. Also, the host infrastructure may include several receiving connectors to facilitate electrical and/or data connectivity to the computing systems installed therein. To aid in easy installation of the computing systems and to facilitate mating of the connectors of the computing systems with the receiving connectors on the host infrastructure, the computing systems may include various mechanisms to bias the computing systems toward the receiving connectors on the host infrastructure. Such biasing mechanisms may create a connector mating force, alternatively also referred to as an engagement force, so that the connectors on a computing system engage with the receiving connectors on the host infrastructure.

In recent state of technology, the number of connections in a connector and/or the number of connectors in the computing systems have increased. As the number of connections in the connector and/or the number connectors increases, the forces needed to facilitate engagement and disengagement between two connectors also generally increase. For example, in a pin-and-slot connector configuration, the frictional resistance between pins and slots increases with the number of pin-and-slot pairs. In certain applications, the appropriate amount of engagement or disengagement force may be burdensome to apply. Additionally, improper application of forces may cause damage to one or both of the connectors. For example, improper application of engagement forces between a pin-and-slot connection pair may cause the pins to misalign with respect to the slots, thereby causing the pins to bend or break.

Some traditional designs of the computing systems use a lever and a cam based insertion mechanisms to install the computing systems in the host infrastructure and to create desired engagement or disengagement forces. The lever and cam based insertion mechanisms used in the traditional designs apply an engagement force for appropriate mating of the connectors by over driving (or over tightening) the lever and the cam. In some instances, such over driving or over tightening of the lever result in deflection/bending of metal parts and/or a backplane supporting the connectors. Sometimes, over driving of the lever may result in permanent banding of the metal parts and/or the backplane on the host infrastructure.

Additionally, in some implementations, the computing systems and the host infrastructure may use direct-mate orthogonal connectors. The direct-mate orthogonal connectors may not be supported via a backplane. Thus, application of excessive engagement force via the lever and the cam may permanently deform and/or damage metal parts (e.g., rails or frames) of the host infrastructure. Accordingly, a desired engagement force for mating of the connectors may not be achieved for any subsequent re-installation of the same or another computing system in the same slot due to deformed or damaged metal parts thereby rendering the slot on the host infrastructure non-usable.

Furthermore, in certain instances, the computing systems may be heavy. Also, in the installed positions in the host infrastructure, the computing systems may experience shock loads of varying magnitudes caused due to reasons, such as but not limited to, transportations, earthquakes, jerks, falls, and the like. Such shock loads and/or the weights of the computing systems, at times, may cause permanent damage to the metal parts (e.g., rails or frames) of the host infrastructure and/or the biasing mechanisms of the computing systems.

In accordance with aspects of the present disclosure, a securing sub-system is presented to address the technical issues discussed above. One or more such securing systems may be disposed in a computing system. Further, in some examples, a computing system having a securing system including a plurality of securing sub-systems is also presented. In some examples, use of the securing sub-system may facilitate necessary engagement force for allowing mating of connectors of the computing system with receiving connectors on a host infrastructure (e.g., a rack and/or an enclosure). In particular, the securing sub-system of the present disclosure, in some examples, achieves high engagement forces useful for facilitating mating of large number of connectors (e.g., direct-mate orthogonal connectors) without causing any structural damage or bending of metal parts of the host infrastructure.

The securing sub-system presented herein includes a lever and a cam assembly engaged with the lever. The cam assembly may be engaged with the lever such that the cam assembly moves due to a pivotal movement of the lever. The cam assembly may include an insertion cam having a cam body and a cantilevered arm extending from the cam body. The cantilevered arm is deformable when the cantilevered arm contacts a restrictive structure and an engagement force applied on the insertion cam increases beyond a predetermined threshold value. The deformed cantilevered arm may return to its original shape once the excessive engagement force applied on the insertion cam reduces (e.g., when the computing system is removed from the host infrastructure). As will be appreciated, use of the insertion cam with a deformable cantilevered arm saves the structure of the host infrastructure from any damage or bending. In particular, upon insertion of the computing system into a structure (e.g., rails) of the host infrastructure and when excessive engagement force is applied to ensure proper mating of the connectors, the cantilevered arm of the insertion cam absorbs any excessive engagement forces by way of its deformation and hence stopping any impact of the insertion forces onto the structure of the host infrastructure.

Moreover, the proposed securing sub-system aids in better management of the shock loads that the computing system may experience while the computing system remain installed on the host infrastructure. In some examples, the cam assembly also includes a load support member disposed on the insertion cam. In particular, at least a portion (hereinafter referred to as an arm backing portion) of the load support member is offset from an open end of the cantilevered arm to limit deformation of the cantilevered arm. As such, the arm backing portion of the load support member may be formed such that there exists some gap between the cantilevered arm and the arm backing portion to allow certain degree of additional movement/deformation of cantilevered arm even after the computing system is installed in the host infrastructure. Accordingly, upon any event causing the shock load on the computing system, the cantilevered arm may further deform or move, however, such deformation or the movement of the cantilevered arm caused due to the shock loads may be limited by the arm backing portion of the load support member. Advantageously, any damage to parts of the securing sub-system and/or the damage or bending of the structure of the host infrastructure may be prohibited. Additionally, the proposed securing system, in some examples, may include two securing sub-systems coupled to each other via a synchronous movement link. The synchronous movement link may facilitate a synchronized movement of parts and distribution of loads within the two securing sub-systems even if only one of the securing sub-systems is operated via respective lever.

Figure 1:
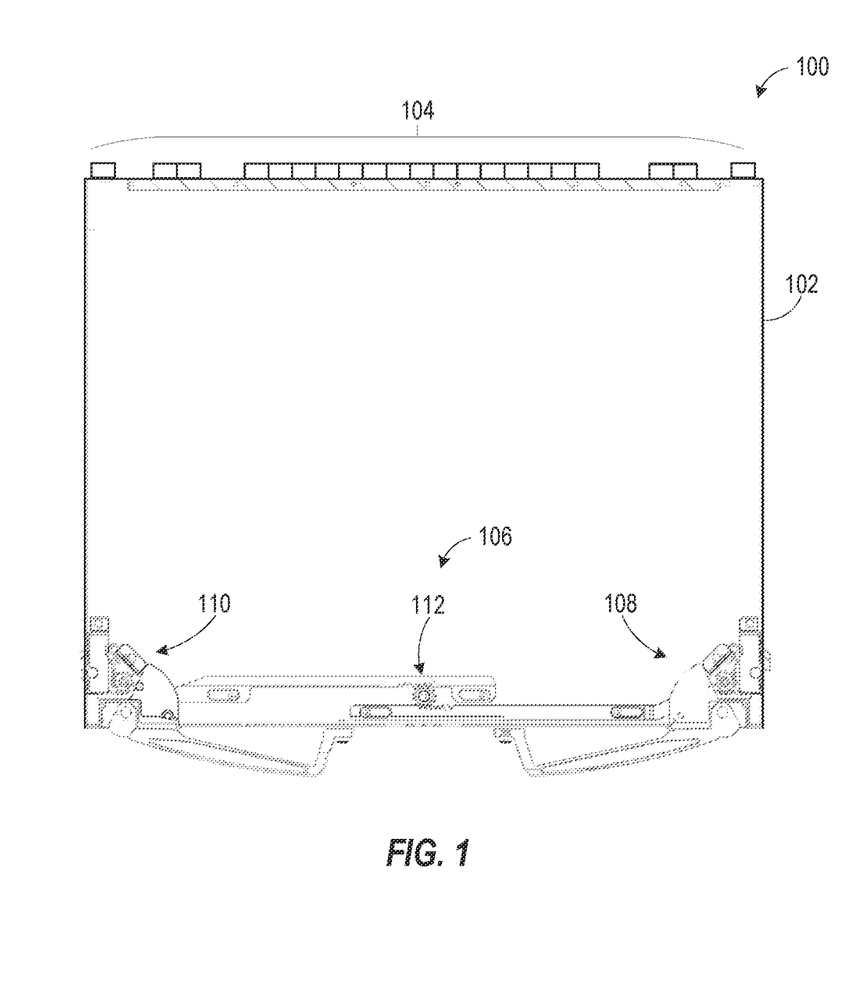
FIG. 1 depicts a top view of a computing system, in accordance with an example.

Referring now to the drawings, in FIG. 1, a top view of a computing system 100 is depicted, in accordance with an example. The computing system 100 may be any electronic system that facilitates data storage, compute, and/or networking capabilities. Examples of the computing system 100 may include, but are not limited to, servers, storage devices, network switches, routers, WLAN access points, and the like. The servers may be blade servers, for example. The storage devices may be storage blades or storage arrays, for example. The example computing system 100 may include a housing 102, a plurality of connectors 104, and a securing system 106. The housing 102 may enclose several electronic components (e.g., processors, storage devices, power supplies, power management systems, system controllers, networking devices, or the like) and/or opto-electronic components (e.g., optical transmitters, optical receivers, optical transceivers, or the like) that enable the computing system 100 to function in a desired manner. Further, the plurality of connectors 104 may facilitate electrical, data, and/or optical communication capabilities to the computing system 100. One or more of the plurality of connectors 104 may be internally connected to the electronic and/or opto-electronic components hosted in the computing system 100.

In some implementations, the computing system 100 may be hosted in an IT infrastructure such as, but not limited to, a data center. The term data center as used herein may refer to an IT infrastructure hosting one or more computing systems such as the computing system 100 at a common location. Sometimes, in a data center, one or more computing systems such as the computing system 100 may be installed on a host infrastructure (not shown) such as a rack or an enclosure. The host infrastructure may facilitate physical space and mechanical support to the computing systems installed therein. In addition to provisioning the space and the mechanical support, the host infrastructure may also include several receiving connectors which may be electrically and/or communicatively coupled to respective connectors 104 of the computing system 100 when the computing system 100 is installed in the host infrastructure. In some implementations, the computing system 100 may include increased number of connectors, at least some of which may include direct-mate orthogonal connectors. Also, in some examples, the host infrastructure may not include a backplane supporting the high number of connectors. As it is apparent that high number of connectors require increased mating/engagement forces to facilitate proper connections there-between.

To that end, the computing system 100 may include the securing system 106 to secure the computing system 100 in the host infrastructure and to facilitate engagement forces to enable mating of the connectors 104 of the computing system 100 with the receiving connectors of the host infrastructure. The securing system 106 may at least partially be disposed inside the housing 102 and is structurally attached to the housing 102. The securing system 106 may allow insertion and/or removal of the computing system 100 from the host infrastructure while ensuring application of an engagement force to cause mating of the connectors 104 with the respective receiving connectors of the host infrastructure without causing damage or bending of a structure of the host infrastructure.

In some examples, the securing system 106 may include at least one securing sub-system, for example, a first securing sub-system 108 and a second securing sub-system 110. In some examples, the securing system 106 may also include a synchronous movement link 112 to synchronize operations of the first securing sub-system 108 and the second securing sub-system 110. In the description hereinafter, for the sake of brevity, structural and functional details of the first securing sub-system 108 will be described with help of FIGS. 2, 3, 4, 5, 6, 7 and 8A-8E. The second securing sub-system 110 may include similar components as that of the first securing sub-system 108 that function in a similar fashion as will be described with reference to the first securing sub-system 108, without limiting the scope of the present disclosure. Further, structural and functional details of the synchronous movement link 112 will be described with help of FIG. 9.

Figure 2:
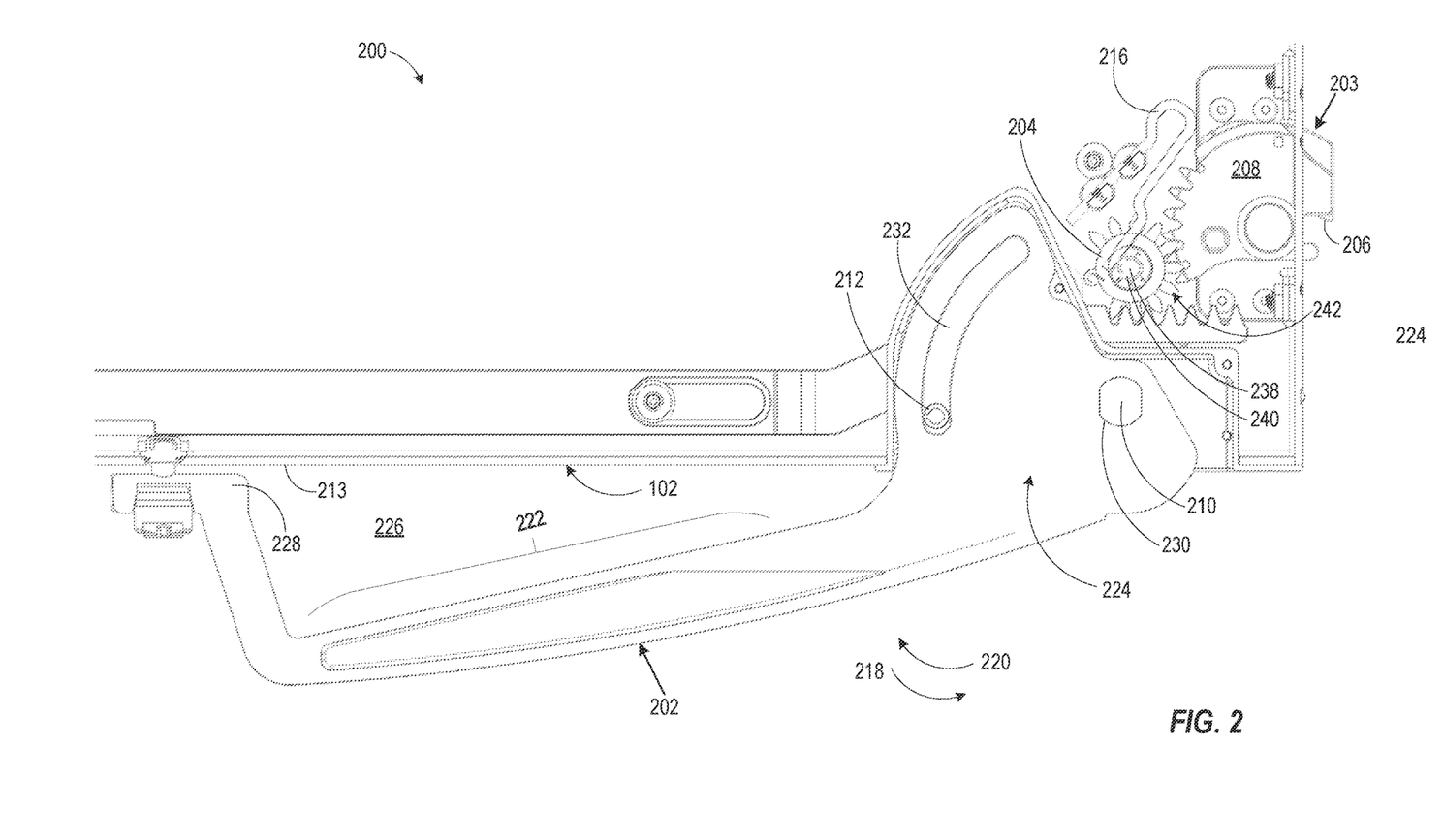
FIG. 2 depicts an enlarged view of a portion of a securing sub-system installed in the computing system of FIG. 1, in accordance with an example.
Figure 3:
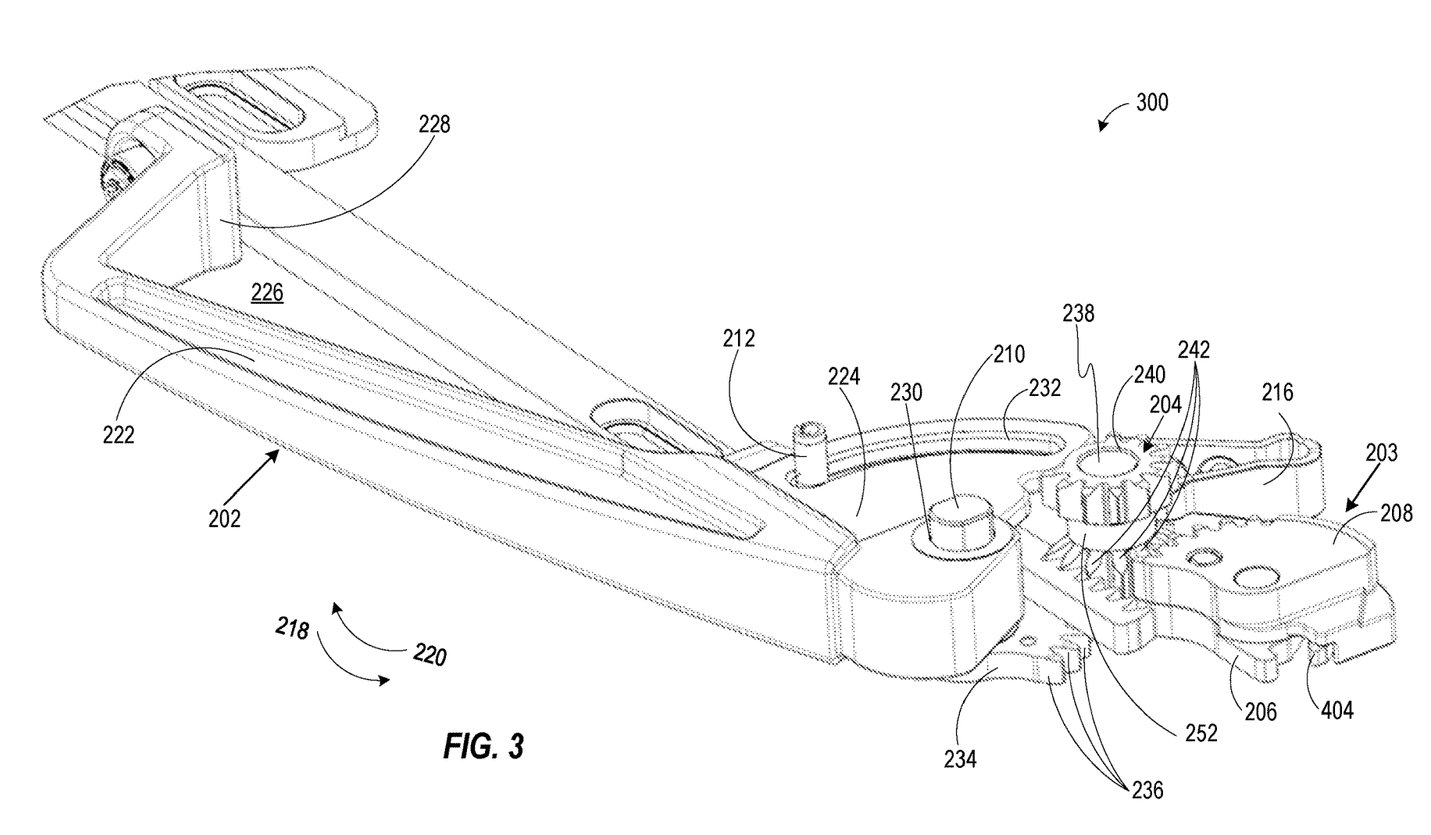
FIG. 3 depicts a perspective view of a portion of a securing sub-system, in accordance with an example.

In the description below, references are made to FIGS. 2 and 3 concurrently. In particular, FIG. 2 depicts an enlarged view 200 of a portion of a securing system 106 showing the first securing sub-system 108 installed in the computing system of FIG. 1, in accordance with an example. Further, FIG. 3 depicts a perspective view 300 of a portion of the first securing sub-system 108, in accordance with an example. In some examples, the first securing sub-system 108 may include two or more of a lever 202, an idler gear 204, a cam assembly 203 having an insertion cam 206 and a load support member 208, a pivot pin 210, a movement limiter pin 212, or an anti-backlash biasing member 216. The lever 202 may be operated by moving the lever 202 in any of directions 218 and 220. For example, the lever 202 may be rotated (e.g., anticlockwise) about the pivot pin 210 in the direction 218. The lever 202 may also be rotated (e.g., clockwise) about the pivot pin 210 in the direction 220 until the lever 202 touches the housing 102. The movement of the lever 202 may cause movements of the idler gear 204, the insertion cam 206, and the load support member 208 resulting in engagement or disengagement of the computing system 100 into the host infrastructure and application of engagement forces to cause mating of the connectors 104 with the receiving connectors on the host infrastructure.

The lever 202 may include a grip portion 222 (alternatively also referred to as a handle) and an engagement portion 224. The grip portion 222 may allow a user to grab the lever 202 and apply force on the lever 202 to move the lever in any of the directions 218, 220. In some examples, the grip portion 222 may have an angular design causing a triangular space 226 between the lever and the housing 102 of the computing system 100 (in the position of the lever 202 shown in FIG. 2) to allow insertion of user's hand to grab the lever 202. In particular, the position of the lever 202 depicted in FIG. 2 represents a resting position of the lever 202 when the lever 202 is rotated/moved in the direction 220 until an end 228 of the grip portion 222 touches a wall 213 of the housing 102. Use of a lever having a grip portion of different shape is also envisioned within the purview of the present disclosure. Further, as depicted in FIG. 2, contact of the end 228 of the grip portion 222 with the housing 102 of the computing system 100 may limit a pivotal movement of the lever 202 in the direction 220.

The engagement portion 224 of the lever 202 may be movably coupled to the housing 102 of the computing system 100. In particular, in some examples, the pivot pin 210 may be attached the housing 102 directly or indirectly (e.g., via one or more intervening parts). Also, the engagement portion 224 may include an opening 230. In some examples, the lever 202 may be mounted on the housing 102 via the pivot pin 210 and is movable with respect to the pivot pin 210. In particular, the lever 202 may be disposed such that the opening 230 receives the pivot pin 210. The inner diameter of the opening 230 is little larger than an outer diameter of the pivot pin 210 to allow pivotal movement of the lever 202 about the pivot pin 210.

The movement limiter pin 212 of the first securing sub-system 108 may limit the pivotal movement of the lever 202 in the direction 218. In particular, as depicted in FIGS. 2 and 3, one end of the movement limiter pin 212 is fixed to the housing 102 directly or indirectly and is spaced apart (e.g., at least a predefined distance) from the pivot pin 210. Additionally, the lever 202, in its engagement portion 224, may include an elongated guide opening 232. The lever 202 may be disposed such that the elongated guide opening 232 receives another end (e.g., an open end) of the movement limiter pin 212. Accordingly, when the lever 202 is operated, the elongated guide opening 232 and the movement limiter pin 212 may limit the movement of the lever 202 beyond certain limit as defined by a length of the elongated guide opening 232. In other words, the lever 202 may move in either direction 220 or direction 218 for the length of the elongated guide opening 232. For example, in the position shown in FIG. 2, the lever 202 is unable to move in direction of 220. This is because the movement limiter pin 212 is at the end of one end of the elongated guide opening 232. Additionally, the end 228 of the grip portion 222 is abutted against the wall 213 of the housing 102.

Further, the lever 202 may include a driver gear 234 (see FIG. 3). In some examples, the driver gear 234 may be an integral part of the lever 202. In other words, the grip portion 222, the engagement portion 224, and the driver gear 234 may form a uni-body (e.g., monolithic) structure of the lever 202. In other examples, the driver gear 234 may be permanently or removably attached to the engagement portion 224 of the lever 202. The driver gear 234 may have first set of teeth 236 which engages with other parts (described later) of the first securing sub-system 108 to cause movements of the other parts due to the pivotal movement of the lever 202.

In some example implementations, the first securing sub-system 108 may include the idler gear 204 function of which is to transfer a force caused by the pivotal movement the lever 202 to the cam assembly 203 having the insertion cam 206 and the load support member 208. However, in certain other examples, the lever 202 may be engaged directly with the cam assembly 203 without the idler gear 204. In the description hereinafter, an example implementation of the first securing sub-system 108 having the idler gear 204 is described for illustration purposes. The idler gear 204 may be installed on an idler pin 238 that is directly or indirectly attached to the housing 102. In particular, the idler gear 204 includes a through hole 240 that receives the idler pin 238 and there exists a predefined clearance between an inner diameter of the through hole 240 and an outer diameter of the idler pin 238 so that the idler gear 204 can rotate upon the pivotal movement of the lever 202.

The idler gear 204 may be disposed such that the idler gear 204 may be engaged with the lever 202 (e.g., with the driver gear 234 of the lever 202) and cam assembly 203. Further, in some examples, to keep the idler gear 204 biased toward the cam assembly 203 and the driver gear 234 and to reduce any unwanted backlash of the idler gear 204, the first securing sub-system 108 may include an anti-backlash biasing member 216. In an example implementation shown in FIGS. 2 and 3, the anti-backlash biasing member 216 is shown as being a u-shaped spring for illustration purposes. In some other examples, any other type of elastic member or a spring may be used as the anti-backlash biasing member 216 at least a portion of which is attached to an idler gear support bracket (not shown) and wherein at least one other portion of the u-shaped spring contacts a tooth-less portion 252 of the idler gear 204. For example, at least a portion of the anti-backlash biasing member 216 may be attached (e.g., via a fastener such as screw, adhesives, or via any type of mounting brackets) to the idler gear support bracket, especially to an inner wall of the idler gear support bracket. Another end of the anti-backlash biasing member 216 may be disposed in contact with the idler gear 204. In particular, the idler gear 204 may have a tooth-less portion 252 (see FIG. 3) adjacent to the second set of teeth 242. The anti-backlash biasing member 216 may contact with the idler gear 204 at the tooth-less portion 252 to apply a biasing force thereon.

The idler gear 204 is rotatable due to the pivotal movement of the lever 202 which causes the cam assembly 203 to move. In order to cause the engagement of the idler gear 204 with the lever 202, the idler gear 204 may include a set of teeth, hereinafter referred to as a second set of teeth 242. As depicted in FIGS. 2 and 3, the second set of teeth 242 is formed on an outer circumference of the idler gear 204. In particular, the idler gear 204 is positioned such that at least some of the second set of teeth 242 engage with at least some of the first set of teeth 236 formed on the driver gear 234 of the lever 202 to translate the pivotal movement of the lever 202 into a rotational movement of the idler gear 204. For example, when the lever 202 is moved in the direction 218 the idler gear 204 rotates in a clockwise direction. Alternatively, when the lever 202 is moved in the direction 220, the idler gear 204 rotates in an anti-clockwise direction.

Figures 4, 6, 7:
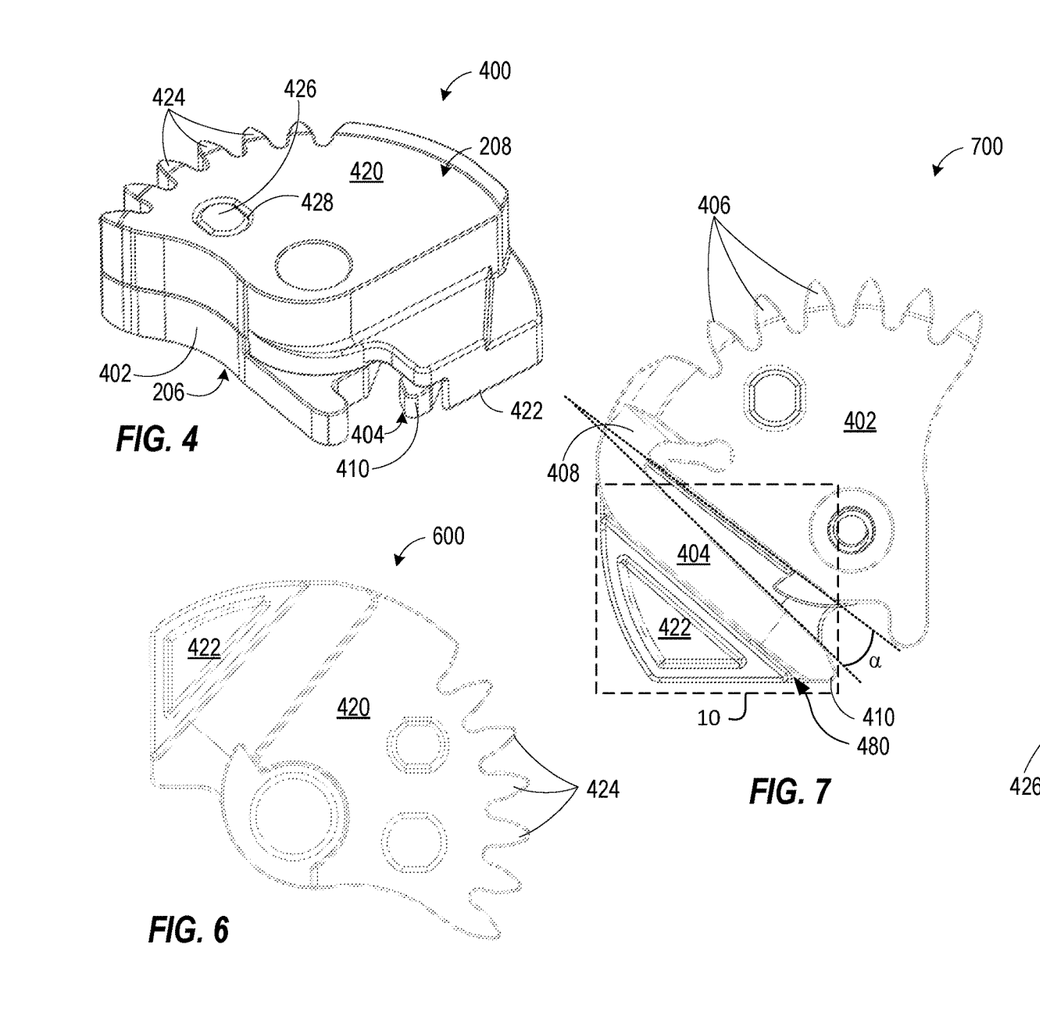
FIG. 4 depicts a perspective view of a cam assembly, in accordance with an example.
FIG. 6 depicts a perspective view of the a load support member of the cam assembly of FIG. 4, in accordance with an example.
FIG. 7 depicts another perspective view of the cam assembly of FIG. 4, in accordance with an example.
Figure 5:
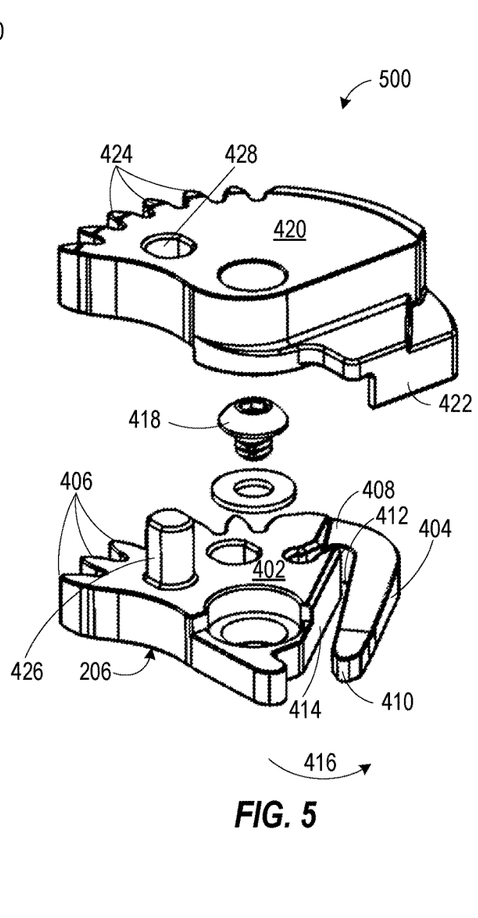
FIG. 5 depicts an exploded view of the cam assembly of FIG. 4, in accordance with an example.

In some examples, the cam assembly 203 may be engaged with the lever 202, directly or via the idler gear 204 (as depicted in FIGS. 2 and 3) and is movable due to a pivotal movement of the lever 202. As depicted in FIGS. 2 and 3, the cam assembly 203 may be engaged with the lever 202 via the idler gear 204 with help of one or more teeth as will be described in greater detail in FIG. 5. Such engagement of the cam assembly 203 with the idler gear 204 may cause an angular movement of the cam assembly 203 based on the rotational movement of the idler gear 204. For example, the clockwise movement of the idler gear 204 may cause the cam assembly 203 to move in the anticlockwise direction, and vice-versa. Additional structural details of the cam assembly 203 will be described in conjunction with FIGS. 4-7. In the description hereinafter, FIGS. 4-7 will be referred to concurrently as they describe perspective views of the cam assembly 203 and/or its parts. For example, FIG. 4 depicts a perspective view 400 of the cam assembly 203. Further, FIG. 5 depicts an exploded view 500 of the cam assembly 203, in accordance with an example. Furthermore, FIG. 6 depicts a perspective view 600 of the load support member 208 of the cam assembly 203, in accordance with an example. Moreover, FIG. 7 depicts another perspective view 700 of the cam assembly 203, in accordance with an example.

As depicted in FIGS. 4-7, the cam assembly 203 includes the insertion cam 206 and the load support member 208 disposed on the insertion cam 206. In some examples, the insertion cam 206 may include a cam body 402 and an arm 404 extending from the cam body 402. The arm 404 is hereinafter referred to as a cantilevered arm 404. In one example, the insertion cam 206 may be made of metal and has a monolithic structure. In some other examples, the insertion cam 206 may be formed by attaching the cantilevered arm 404 to the cam body 402. The cam body 402 may be a block of material (e.g., metal) and may generally have a triangular shape, although the present disclosure is not limited with respect to the shape of the cam body 402. To aid in the engagement of the insertion cam 206 with the idler gear 204 (or directly with the driver gear 234, in some examples) the cam body 402 may include a set of teeth, hereinafter referred to as a third set of teeth 406 formed on at least a portion of an edge of the cam body 402. The insertion cam 206 may be positioned such that at least some of the third set of teeth 406 may be engaged with at least some of the second set of teeth 242 formed on the idler gear 204 causing an angular movement of the insertion cam 206 based on the rotational movement of the idler gear 204.

Further, when the computing system 100 is inserted in the host infrastructure, the cam assembly 203, in particular, the cantilevered arm 404 of the insertion cam 206 contacts a restrictive structure (e.g., a pin or a metal bar) formed on the host infrastructure. The position of the restrictive structure may be set according to the size of the computing system 100 such that the connectors 104 of the computing system 100 engage with the receiving connectors on the host infrastructure. While one end 408 (hereinafter referred to as a fixed end 410) of the cantilevered arm 404 is fixed (or merged) with the cam body 402, another end 410 remains open ended (hereinafter referred to as an open end 410). When the computing system 100 is inserted in the host infrastructure and when the lever 202 is moved in the direction 220, at some position of the lever 202, the open end 410 of the cantilevered arm 404 may contact the restrictive structure (see FIGS. 8A-8E). Any further movement of the lever 202 in the direction 220 (see FIG. 2) may cause excessive engagement force. Such excessive engagement force may be transferred the cantilevered arm 404 via the driver gear 234, the idler gear 204, and the cam body 402.

In some examples, the cantilevered arm 404 is made of metal or any other material that is deformable when the open end 410 of the cantilevered arm contacts the restrictive structure on the host infrastructure and any excessive engagement force is applied on the lever 202 in the direction 220. In particular, the cantilevered arm 404 may be deformed such that an angle (a) (see FIG. 7) between an inner surface 412 of the cantilevered arm 404 and an inner surface 414 of the cam body 402 increases. In other words, upon application of the excessive engagement forces, the cantilevered arm 404 may bend from the fixed end 408 in the direction 416 (see FIG. 5) causing the open end 410 of the cantilevered arm 404 to move away from the cam body 402. As will be appreciated, use of the insertion cam 206 with the deformable cantilevered arm 404 saves the structure of the host infrastructure from any damage or bending. In particular, upon insertion of the computing system 100 into a structure (e.g., rails) of the host infrastructure and when excessive engagement force is applied to ensure proper mating of the connectors 104 with the receiving connectors of the host infrastructure, the cantilevered arm 404 absorbs the excessive engagement forces by way of its deformation and hence stopping any impact of the excessive engagement forces onto the structure of the host infrastructure. Also, the cantilevered arm 404 is able to regain its original shape when the excessive engagement force is removed. Advantageously, subsequent re-installations of the computing system 100 in the host infrastructure at the same location may be possible while ensuring proper engagement of the connectors.

In certain instances, in the installed positions in the host infrastructure, the computing system 100 may experience shock loads of varying magnitudes caused due to reasons, such as but not limited to, transportations, earthquakes, jerks, falls, and the like. As will be understood, too much bending or deformation of the cantilevered arm 404 caused due to the shock loads may increase chances of breaking or permanently deforming the cantilevered arm 404. In order to avoid any such adverse impacts of the shock loads, the cam assembly 203 includes the load support member 208 disposed on the insertion cam 206 (see FIGS. 4-7). In some examples, the load support member 208 may be attached to the insertion cam 206 via fasteners, such as, a screw 418, mounting brackets, or using one or more adhesives.

In some examples, the load support member 208 may include a body portion 420 and an arm backing portion 422. In some examples, the body portion 420 may include a plurality of teeth, hereinafter referred to as a fourth set of teeth 424 that is similar to the third set of teeth 406. The load support member 208 may be disposed on the insertion cam 206 such that the fourth set of teeth 424 is aligned with the third set of teeth 406 formed on the cam body 402 as depicted in FIG. 4. Further, in order to avoid any misalignment between the fourth set of teeth 424 and the third set of teeth 406, in some examples, the cam body 402 includes a protrusion 426 and the body portion 420 of the load support member 208 includes an opening 428 that is aligned to the protrusion 426. The load support member 208 may be disposed on the insertion cam 206 such that the protrusion 426 is received into the opening 428.

Figure 10:
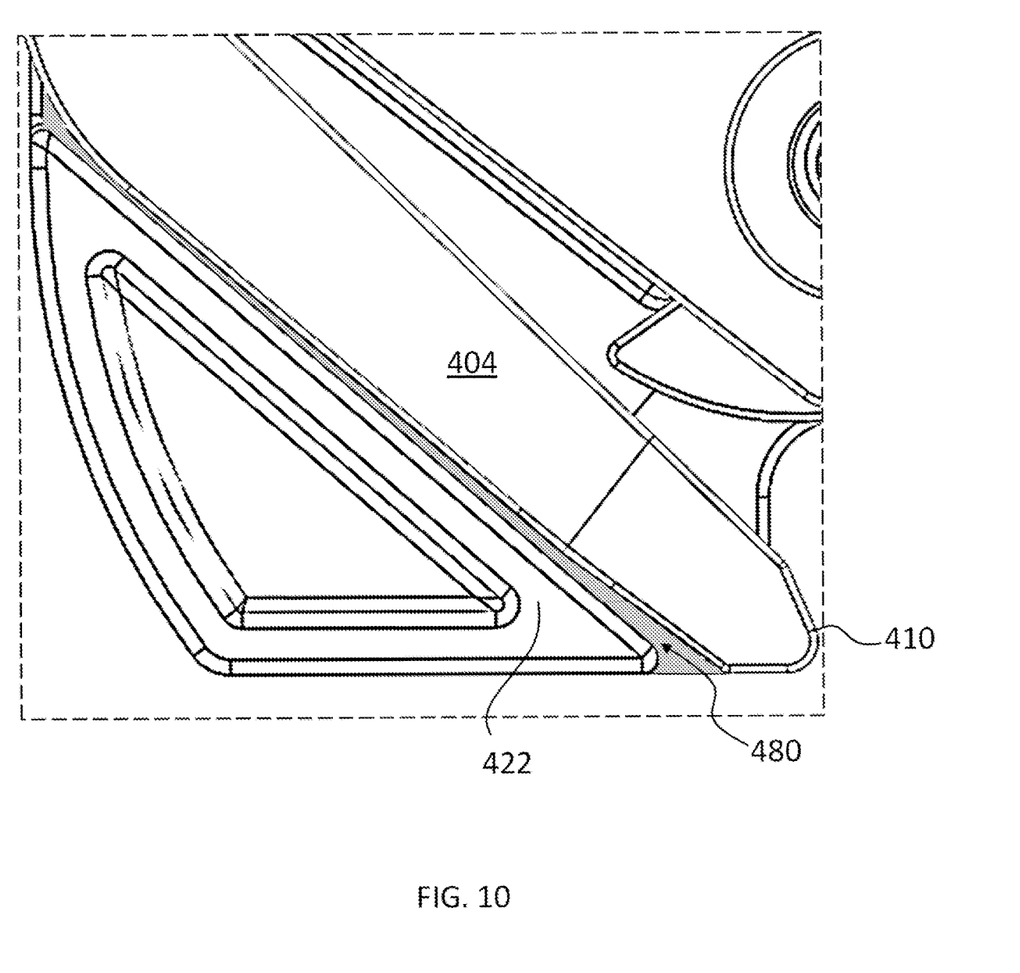
FIG. 10 depicts an enlarged view of the region 10 in FIG. 7.

While the body portion 420 of the load support member 208 is attached the cam body 402, the arm backing portion 422 is positioned close to the cantilevered arm 404. In particular, the body portion 420 of the load support member 208 is offset from (e.g., spaced apart from) an open end 410 of the cantilevered arm 404 to limit deformation of the cantilevered arm beyond certain distance. In particular, as shown in FIGS. 7 and 10, the arm backing portion 422 of the load support member 208 may be formed such that there exists a gap 480 between the cantilevered arm 404 and the arm backing portion 422 to allow certain degree of additional movement/deformation of cantilevered arm 404 even after the computing system 100 is installed in the host infrastructure. In FIG. 10, the space corresponding to the gap 480 is shaded to make it easier to see. As such, upon experiencing any shock load, the cantilever arm 404 can deform up-to a point where the open end 410 of the cantilever arm 404 touches the arm backing portion 422 of the load support member 208. Accordingly, upon any event causing shock load on the computing system 100, the cantilevered arm 404 may further deform or move, however, such deformation or the movement of the cantilevered arm 404 caused due to the shock loads may be limited by the arm backing portion 422 of the load support member 208. In some examples, a distance between the arm backing portion 422 and the cantilevered arm 404 may be set in accordance with a predetermined degree deformation that the insertion cam 206 is designed to allow. Advantageously, use of the load support member 208 having the arm backing portion 422 not only prevent any damage to parts (e.g., the cantilevered arm 404) of the securing sub-system but also saves the structure of the host infrastructure from any damage or bending during shock loads.

Referring now to FIG. 8A-8E, FIGS. 8A, 8B, 8C, 8D, and 8E respectively depict perspective views 800, 802, 804, 806, 808 showing positions of the insertion cam 206 with respect to a restrictive structure 810 of the host infrastructure illustrating a movement of the insertion cam 206 on application of an engagement force via the lever 202 and/or a lever of the second securing sub-system 110, in accordance with an example. FIGS. 8A-8E are described in conjunction with FIGS. 1 and 2. In some examples, once the computing system 100 is inserted into the host infrastructure, a user may operate the lever 202 of the first securing sub-system 108 and/or the lever of the second securing sub-system 110. In order to create the engagement force causing mating of the connectors 104 of the computing system 100 with the receiving connectors of the host infrastructure, the lever 202 may be moved in the direction. In some examples, alternatively or together with the movement of the lever 202, the lever of the second securing sub-system 110 may be moved in the direction 220 to create the engagement force. In some examples, the perspective views 800, 802, 804, 806, 808 respectively depict the positions of the insertion cam 206 as the lever 202 is gradually moved in the direction 220 toward the housing 102 of the computing system 100.

Figure 8A:
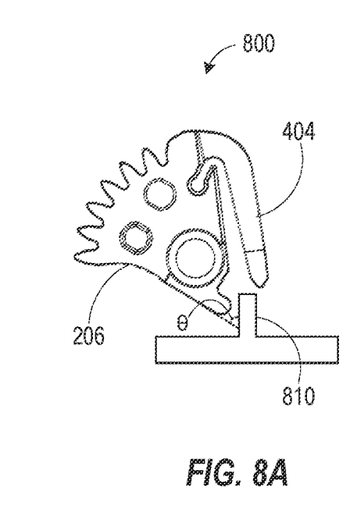
FIGS. 8A-8E depict perspective views illustrating a movement of an insertion cam upon application of an engagement force, in accordance with an example.
Figure 8B:
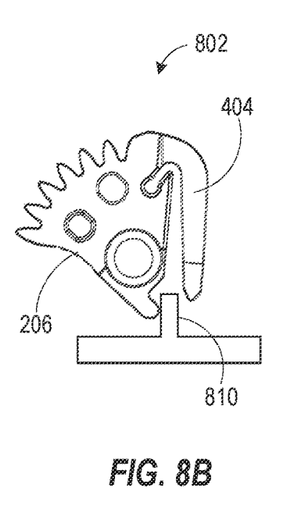
Figure 8C:
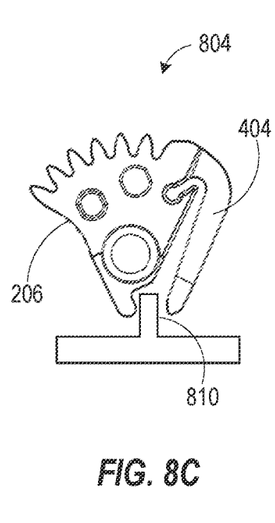
Figure 8D:
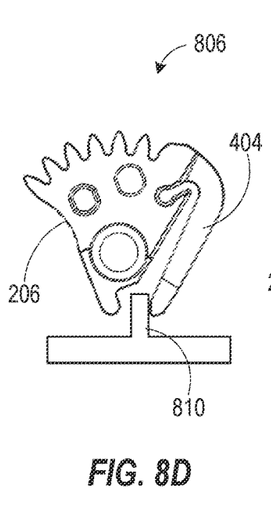
Figure 8E:
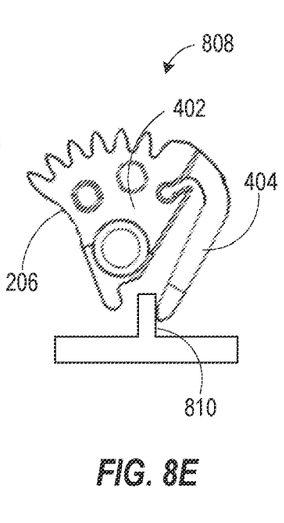

As depicted in FIGS. 8A-8E, as the engagement force is applied by operating the lever 202, for example, an angle θ between an edge of the insertion cam 206 and the restrictive structure 810 reduces as the insertion cam 206 experiences an angular movement in a direction 812. In particular, the perspective view 806 of FIG. 8D depicts a position of the insertion cam 206 when the cantilevered arm 404 comes in contact with the restrictive structure 810. When any excessive engagement force is applied after the insertion cam 206 has attained the position depicted in FIG. 8D, the excessive engagement force may be absorbed by the cantilevered arm 404 resulting in deformation of the cantilevered arm 404 as described earlier. As can be seen in the perspective view 808 shown in FIG. 8E, the cantilevered arm 404 deforms by way of bending away from the cam body 402. Advantageously, such deformation of the cantilevered arm 404 stops propagation of the excessive engagement forces onto the restrictive structure 810.

Figure 9:
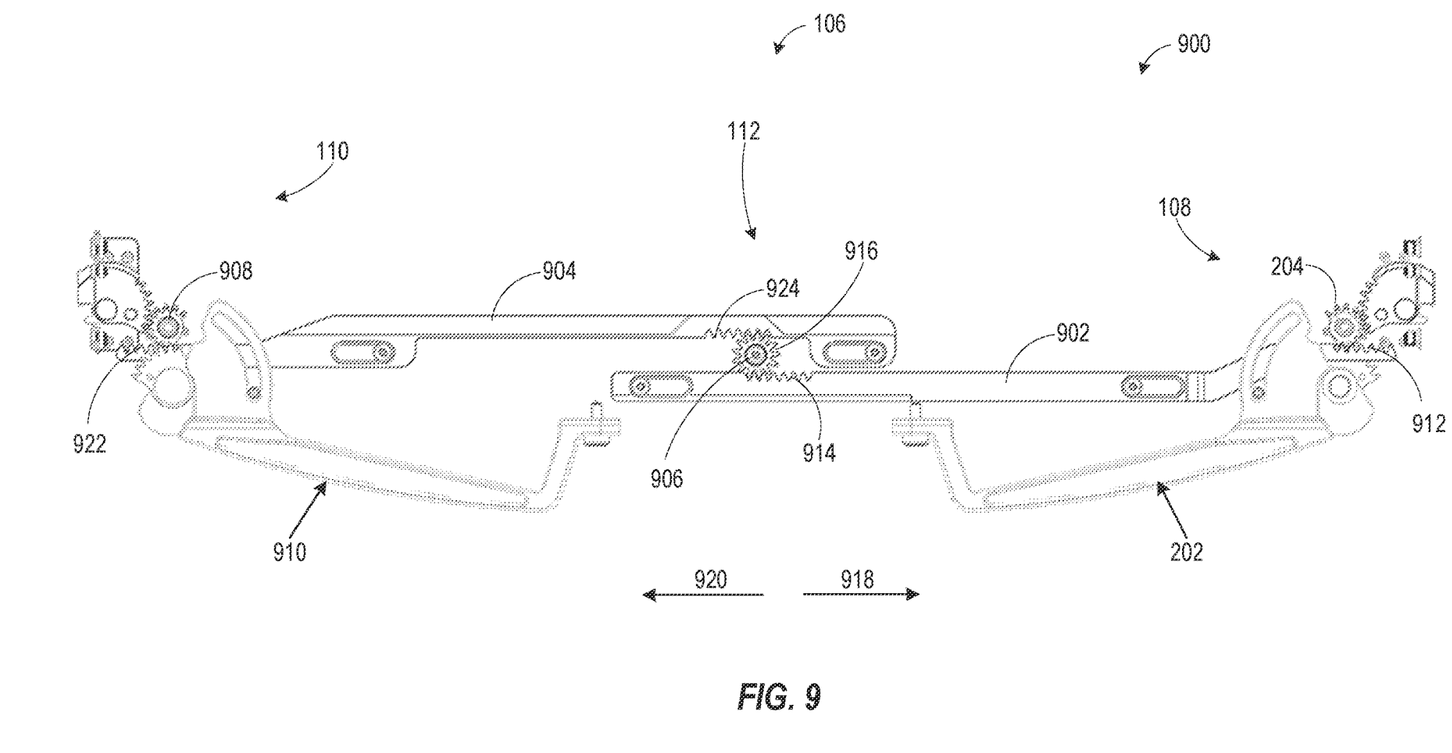
FIG. 9 depicts a securing system, in accordance with an example.

Referring now to FIG. 9, a perspective view 900 of a securing system such as the securing system 106 of FIG. 1 is depicted, in accordance with an example. As previously noted, the securing system 106 may at least partially be disposed inside the housing 102 and is structurally attached to the housing 102. In some examples, the securing system 106 may include the first securing sub-system 108 and the second securing sub-system 110. In some examples, the securing system 106 may also include the synchronous movement link 112. The synchronous movement link 112 couples the first securing sub-system 108 to the second securing sub-system 110 and synchronizes the movements of the parts of the first securing sub-system 108 and the second securing sub-system 110. In particular, the synchronous movement link 112 is engaged with the idler gear 204 of the first securing sub-system 108 and an idler gear 908 of the second securing sub-system 110 such that the rotational movement of any of the idler gear 204 or 908 may cause linear movements within the synchronous movement link.

In some examples, the synchronous movement link 112 may include a first link bar 902, a second link bar 904, and a link gear 906. The first link bar 902 may be engaged with the idler gear 204 of the first securing sub-system 108 and the second link bar 904 may be engaged with the idler gear 908 (similar to the idler gear 204) of the second securing sub-system 110. Moreover, the link gear 906 may be engaged with both the first link bar 902 and the second link bar 904 to allow a linear movement of the first link bar 902 and a linear movement of the second link bar 904 upon movement of the lever 202 of the first securing sub-system 108 or a lever 910 (similar to the lever 202) of the second securing sub-system 110.

In particular, to allow the engagement of the first link bar 902 with the idler gear 204 and the link gear 906 the first link bar 902 may include a plurality of first linear teeth 912 and a plurality of second linear teeth 914 spaced apart from the plurality of first linear teeth 912. In particular, the first link bar 902 may be positioned such that the at least some of the plurality of first linear teeth 912 engage with the idler gear 204 of the first securing sub-system 108 so that the rotational movement of the idler gear 204 may cause the linear movement of the first link bar 902. Also, at least some of the plurality of second linear teeth 914 may be engaged with the one or more of teeth 916 formed on the link gear 906. Accordingly, the link gear 906 may rotate in depending on the liner movement of the first link bar 902. For example, a movement of the first link bar 902 in a direction 918 may cause the link gear 906 to rotate in an anticlockwise direction, whereas the movement of the first link bar 902 in a direction 920 may cause the link gear 906 to rotate in a clockwise direction. The movement of the link gear 906 in the anticlockwise direction may cause the second link bar 904 to move in the direction 920, whereas the movement of the link gear 906 in the clockwise direction may cause the second link bar 904 to move in the direction 918. As the second link bar 904 is engaged with the idler gear 908 of the second securing sub-system 110, the liner movement of the second link bar 904 may cause the movements of the idler gear 908 and any other parts of the second securing sub-system 110 connected to the idler gear 908.

Similarly, in some examples, the second link bar 904 may include a plurality of third linear teeth 922 and a plurality of fourth linear teeth 924 spaced apart from the plurality of third linear teeth 922. In particular, the second link bar 904 may be positioned such that the at least some of the plurality of third linear teeth 922 engage with the idler gear 908 of the second securing sub-system 110 so that the rotational movement of the idler gear 908 may cause the linear movement of the second link bar 904. Also, at least some of the plurality of fourth linear teeth 924 may be engaged with the one or more of teeth 916 formed on the link gear 906. Accordingly, the link gear 906 may rotate in depending on the liner movement of the second link bar 904. For example, a movement of the second link bar 904 in a direction 918 may cause the link gear 906 to rotate in the clockwise direction, whereas the movement of the second link bar 904 in the direction 920 may cause the link gear 906 to rotate in the anticlockwise direction. The movement of the link gear 906 in the anticlockwise direction may cause the first link bar 902 to move in the direction 918, whereas the movement of the link gear 906 in the clockwise direction may cause the first link bar 902 to move in the direction 920. As the first link bar 902 is engaged with the idler gear 204 of the first securing sub-system 108, the liner movement of the first link bar 902 may cause the movements of the idler gear 204 and any other parts of the first securing sub-system 108 connected to the idler gear 204.

As will be appreciated, use of the synchronous movement link 112 in the securing system 106 may facilitate a synchronized movement of parts and distribution of loads within the first securing sub-system 108 and the second securing sub-system 110 even if only one of the levers 202 or 910 is operated. Accordingly, the computing system 100 may be installed into the host infrastructure or removed from the host infrastructure by operating any one or both of the levers 202 or 910.

While certain implementations have been shown and described above, various changes in from and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A securing sub-system for securing an electronic device to a host infrastructure, the securing sub-system comprising:
   a lever; and
   a cam assembly engaged with the lever and movable due to a pivotal movement of the lever, wherein the cam assembly comprises:
   an insertion cam comprising a cam body and a cantilevered arm extending from the cam body, wherein the cantilevered arm is configured to, in response to motion of the insertion cam in a first direction, engage a restrictive structure of the host infrastructure to drive insertion of the electronic device into the host infrastructure, wherein the cantilevered arm is deformable in response to engagement with the restrictive structure; and
   a load support member disposed on the insertion cam, wherein the load support member comprises an arm backing portion, wherein at least part of the cantilevered arm is positioned between the arm backing portion and the cam body such that the arm backing portion limits an amount of deformation of the cantilevered arm by limiting a range of motion of the cantilevered arm relative to the cam body.

2. The securing sub-system of claim 1, wherein the lever is mounted on a housing of the electronic device via a pivot pin and is movable with respect to the pivot pin.

3. The securing sub-system of claim 2, further comprising a movement limiter pin attached to the housing and spaced apart from the pivot pin to limit the pivotal movement of the lever, and wherein the lever comprises an elongated guide opening to receive the movement limiter pin.

4. The securing sub-system of claim 1, further comprising an idler gear engaged with the lever and the cam assembly, wherein the idler gear is rotatable due to a pivotal movement of the lever which causes the cam assembly to move.

5. The securing sub-system of claim 4, wherein the lever comprises a driver gear having a first set of teeth and the idler gear comprises a second set of teeth, wherein the idler gear is positioned such that the first set of teeth engages with the second set of teeth to translate the pivotal movement of the lever into a rotational movement of the idler gear.

6. The securing sub-system of claim 5, wherein the insertion cam comprises a third set of teeth engaged with the second set of teeth to cause an angular movement of the cam assembly based on the rotational movement of the idler gear.

7. The securing sub-system of claim 5, further comprising an anti-backlash biasing member to bias the idler gear toward the cam assembly and the driver gear.

8. The securing sub-system of claim 7, wherein the idler gear comprises a tooth-less portion and wherein the anti-backlash biasing member comprises u-shaped spring, wherein at least one other portion of the u-shaped spring contacts the tooth-less portion of the idler gear to bias the idler gear toward the cam assembly and the driver gear.

9. The securing sub-system of claim 1, wherein the insertion cam further comprises a protrusion formed on the cam body and the load support member comprises an opening that is aligned to the protrusion, and wherein the load support member is positioned such that the protrusion is received into the opening formed in the load support member.

10. A securing system, comprising:
a first securing sub-system comprising a first instance of the securing sub-system of claim 1; and
a second securing sub-system coupled to first securing sub-system via a synchronous movement link, wherein the second securing subsystem comprises a second instance of the securing sub-system of claim 1
wherein the synchronous movement link is engaged with the idler gear such that the rotational movement of the idler gear causes linear movements within the synchronous movement link.

11. The securing system of claim 10, wherein the synchronous movement link comprises:
a first link bar engaged with the idler gear of the first securing sub-system;
a second link bar engaged with the idler gear of the second securing sub-system; and
a link gear engaged with the first link bar and the second link bar to allow a linear movement of the first link bar and a linear movement of the second link bar.

12. The securing system of claim 11, wherein the first link bar comprises a plurality of first linear teeth and a plurality of second linear teeth spaced apart from the plurality of first linear teeth, wherein the plurality of first linear teeth engages with the idler gear of the first securing sub-system so that the rotational movement of the idler gear causes the linear movement of the first link bar, and wherein the plurality of second linear teeth engages with the link gear so that the linear movement of the first link bar causes the linear movement of the second link bar.

13. The securing system of claim 11, wherein the second link bar comprises a plurality of third linear teeth and a plurality of fourth linear teeth spaced apart from the plurality of third linear teeth, wherein the plurality of third linear teeth engages with the idler gear of the second securing sub-system so that the rotational movement of the idler gear causes the linear movement of the second link bar, and wherein the plurality of fourth linear teeth engages with the link gear so that the linear movement of the second link bar causes the linear movement of the first link bar.

14. The securing system of claim 10, wherein the insertion cam further comprises teeth formed on the cam body, wherein the teeth formed on the cam body engages with the idler gear.

15. An electronic system, comprising:
a housing enclosing one or more electronic components; and
the securing sub-system of claim 1 coupled to the housing to secure the housing on a rack.

16. The electronic system of claim 15, wherein the securing sub-system further comprises an idler gear engaged with the lever and the insertion cam, wherein the idler gear is rotatable due to a pivotal movement of the lever which causes the cam assembly to move.

17. The electronic system of claim 16, wherein the securing sub-system further comprises an anti-backlash biasing member disposed in contact with the idler gear to bias the idler gear toward the cam assembly.

18. The electronic system of claim 16, wherein the securing sub-system comprises a first securing sub-system and a second securing sub-system coupled to each other via a synchronous movement link.

19. The electronic system of claim 18, wherein the synchronous movement link comprises:
a first link bar engaged with the idler gear of the first securing sub-system;
a second link bar engaged with the idler gear of the second securing sub-system; and
a link gear engaged with the first link bar and the second link bar to allow a linear movements of the first link bar and the second link bar.

20. The securing sub-system of claim 1, wherein the arm backing portion is arranged such that, in an installed state of the electronic device in the host infrastructure, there is a gap between the cantilevered arm and the arm backing portion such that the cantilevered arm can move relative to the cam body.

* * * * *